United States Patent [19]

Rouy et al.

[11] Patent Number: 5,594,693
[45] Date of Patent: Jan. 14, 1997

[54] MATRIX DEVICE WITH REDUNDANCY FUSES FOR INTEGRATED MEMORY

[75] Inventors: Olivier Rouy, Aix en Provence; Jean-Marie B. Gaultier, Rousset, both of France

[73] Assignee: SGS-Thomson Microelectronics S.A., Saint Genis Pouilly, France

[21] Appl. No.: 408,016

[22] Filed: Mar. 21, 1995

[30] Foreign Application Priority Data

Mar. 31, 1994 [FR] France .................................. 94 03845

[51] Int. Cl.$^6$ .................................................. G11C 29/00
[52] U.S. Cl. .................. 365/200; 365/185.09; 365/225.7
[58] Field of Search ..................................... 365/200, 201, 365/96, 225.7, 185.09

[56] References Cited

U.S. PATENT DOCUMENTS

| | | | |
|---|---|---|---|
| 4,546,454 | 10/1985 | Anil Gupta et al. .................... | 365/200 |
| 5,204,836 | 4/1993 | Reed ........................................ | 365/200 |

*Primary Examiner*—Tan T. Nguyen
*Attorney, Agent, or Firm*—David M. Driscoll; James H. Morris; John N. Anastasi

[57] ABSTRACT

An integrated circuit memory organized in rows and columns of memory cells and having a plurality of redundancy fuses for storing an address of defective rows and columns of the memory cells, in the redundancy fuses, and for selecting a replacement redundant element when an address of a defective row or column is detected. The address code of each defective row or column is recorded in a column of redundancy fuses, each row of the column comprising two cells per digit of the address code, each cell being responsive to either the digit itself or its complement. During a reading of the integrated circuit, only the column that corresponds to the previously recorded address code will not be characterized by a current flow and will be selected as the associated redundant element.

17 Claims, 1 Drawing Sheet

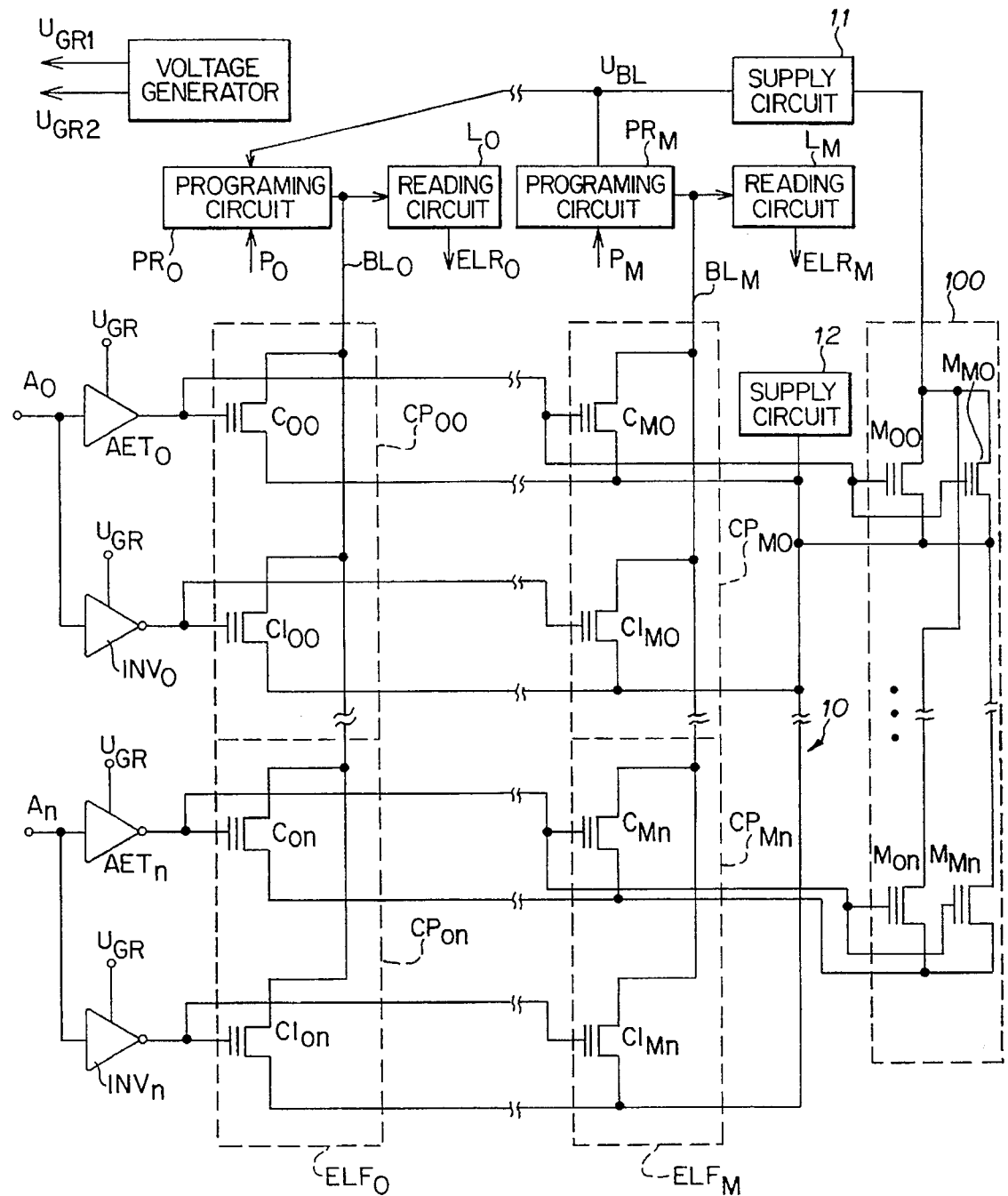

MATRIX DEVICE WITH REDUNDANCY FUSES FOR INTEGRATED MEMORY

BACKGROUND OF THE INVENTION

1. Field of the Invention

The invention relates to electrically erasable and programmable non-volatile type memories in integrated circuit form and, more particularly in such memories, to a matrix arrangement of redundancy fuses for "FLASH EEPROM" type memories.

2. Discussion of the Related Art

These memories are commercially available for a given capacity, for example 16 megabits for a FLASH EEPROM. Now, the methods used to manufacture integrated circuits very often give rise to defects, notably defects that affect memory cells. Hence, to avoid having an excessively large number of rejects, the manufacturers of these circuits make provision for a certain number of redundant cells designed to replace the defective cells if necessary.

These memories are generally organized in matrices formed by rows and columns of memory cells. Each memory cell can then be selected by a word line associated with each row and a bit line associated with each column. In practice, for reasons of simplicity, the replacement of a defective memory cell is done by replacing the entire row or column that contains this cell. The memory element (row or column memory element) that has to be replaced will depend on the type of defect detected. These redundant elements are put into operation following tests carried out after the manufacture of each integrated circuit. To this end, programmable reconfiguration means are provided for in the integrated circuit so that when the test reveals a defective element, this defective element is automatically replaced by a replacement element chosen from among the redundant elements, and this replacement must be invisible and have no effect on the performance characteristics of the memory. In practice, the reconfiguration means contain circuits to ascertain that the current address present in the memory corresponds to that of a defective element and, if this is the case, these means select a redundant element to replace the defective element.

This automatic replacement is usually done by means of non-volatile programmable registers designed to contain the addresses of the defective elements. In the case of a memory organized in rows and columns, this address will be either the row address or the column address. To make these programmable registers, elements known in the broad sense of the term as "fuses" are used: a fuse defines a binary information element having two states (either intact or programmed). For each defective address to be recorded, a battery of several fuses is used, the number of fuses being equal to the number of bits used to define an address. For a p-bit address, there is a battery of p fuses. The state, whether intact or programmed, of the different fuses of a battery defines a p-bit address. If there are N redundancy rows or columns, i.e. if N defective rows or columns need to be replaced by replacement rows or columns, then N batteries are needed.

Furthermore, with each battery of fuses, there is associated a fuse called a validation fuse for indicating whether the corresponding battery is used or not.

When a replacement element is needed to replace a defective element, the address of this defective element is stored in a battery of fuses and a validation fuse associated with this battery is fused or blown out to indicate that it is actually used to define a replacement operation.

The fuses may be physical fuses (elements of an open circuit that is converted into a short circuit when it is blown out, or vice versa) or, more commonly, the fuses may be non-volatile memory elements such as transistors that are programmed and can no longer be erased thereafter. The blank or intact state of the transistor corresponds to an original condition of the fuse. The programmed state of the transistor corresponds to a blown-out state of the fuse.

Up to now, each redundant element has been associated with a register as well as with a comparator for receiving a value contained in this register and the current address as inputs. When the testing operations are over, the registers are programmed at values representing the addresses of the defective elements. Thus, during operation, if the current address coincides with the value contained in one of the registers, the associated comparator delivers a signal enabling the automatic selection of the associated redundant element. At the same time, the selection of the defective element is inhibited.

This approach therefore requires a number of programmable registers that are equal to the number of redundant elements, each register being associated, by a digit of the address code, with a programming circuit and with a reading circuit. Thus, there is required one programming circuit and one reading circuit for each fuse. This takes up a non-negligible amount of space in the integrated circuit.

Furthermore, this approach requires as many registers to be programmed as there are defective elements detected. However, the presence of non-volatile programmable registers raises problems of reliability due to the fact that they are difficult to manufacture and to program.

In addition to these programmable registers, the programming and reading circuits, each associated with a battery of fuses, take up even more space in the integrated circuit.

SUMMARY OF THE INVENTION

The object of the invention is therefore to implement a matrix device with redundancy fuses that makes it possible to reduce the amount of space taken up by the circuits providing access to the redundant elements and increase the reliability of the system.

According to the invention, a device having plurality of redundancy fuses are disposed within a memory which is organized in rows and columns of memory cells and comprises several redundant elements, an "element" being either a row or a column of the redundancy fuses, that are designed to replace elements of memory cells that include at least one defective cell. The redundancy fuses are designed to record an address of the defective element and to select the redundant element to replace the defective element when the address of this defective element is recognized. The device includes, for each redundant element, a column of memory cells arranged in pairs, each memory cell of a pair of memory cells being responsive either directly to a digit of the address code or to its complement.

The device further includes a programming circuit which provides, to said redundant column, an indication that a column of memory corresponding to the address code has a defective element, and a reading circuit which detects a presence or an absence of a current in said column of redundant fuses, said reading circuit providing a signal for selection of the redundant element associated with said defective column when no column current is detected in the redundant column.

BRIEF DESCRIPTION OF THE DRAWINGS

The foregoing and other objects, features and advantages of the present invention shall appear from the following description of a particular exemplary embodiment, as illustrated by the drawings in which:

The FIGURE is a schematic diagram of a redundant circuit according to the present invention.

DETAILED DESCRIPTION

An integrated circuit memory incorporating a matrix device with redundancy fuses according to the present invention may comprise, in a standard way, a network of rows and columns of cells that can be addressed by means of a row decoder and a column decoder. The row decoder is used to designate a determined row when it receives a row address. The column decoder receives a column address and activates a multiplexer accordingly to designate a determined word of the selected line. The multiplexer then selects columns corresponding to this word and enables the connection of these columns to input-output terminals. These terminals are used for the transmission, in the reading mode or in the writing mode, of a word of data recorded in the memory. This organization, while not the only one possible, is the form most generally used and shall be taken as the basis for illustrating the present invention.

The integrated circuit of the memory furthermore comprises a set of redundancy circuits. To simplify the description, it shall be assumed, by way of example only, that the redundancy elements used are repair columns designed to replace defective columns. However there could also be repair rows to replace defective rows.

A respective routing device is provided for each repair column. This routing device performs the following functions:

it stores an address of the defective column in its memory;

it receives the column address applied to the input of the memory;

it compares the addresses and remains inactive if the column address does not correspond to the recorded address; and it couples the repair column, instead of the defective column, to the input-output contacts if the column address corresponds to the defective column.

Referring to the Figure, according to the invention, a matrix device with redundancy fuses comprises, in the case of a number (M+1) of repair columns, (M+1) columns or batteries of fuses $ELF_0$ to $ELF_M$. Each battery has as many pairs of fuses as there are digits $A_0$ to $A_n$ in the address code, giving (n+1) pairs $CP_{00}$ to $CP0_n$ for the column $ELF_0$ and (n+1) pairs $CPM_0$ to $CPM_n$ for the column $ELF_m$. Each pair of fuses is constituted, for the pair $CP_{00}$, by a first floating-gate transistor $C_{00}$, the gate of which receives the signal corresponding to the digit $A_0$ of the address code by means of a voltage-raising amplifier $AET_0$, and a second floating-gate transistor $CI_{00}$ the gate of which receives, through an inverter circuit $INV_0$, the same digit $A_0$ of the address code. In other words, the gate of $CI_{00}$ receives a signal that is the complement of $A_0$. Each amplifier $AET_0$ to $AET_n$ and each inverter circuit $INV_0$ to $INV_n$ is connected to a voltage generator $U_{GR}$ that gives two voltages, a programming voltage $U_{GR1}$=12 volts and a reading voltage $U_{GR2}$=5 volts.

Each digit $A_0$ to $A_n$ of the address code is applied to the gates of the respective pairs, of the pairs of fuses, that are aligned in a column.

A source of each of the transistors is coupled to a first supply circuit 12 while a drain of each of the transistors is coupled to a second supply circuit 11 by means of a programming circuit. Each column is thus connected, respectively, to a programming circuit $PR_O$ to $PR_M$ and to a reading circuit $L_0$ to $L_M$. Each programming circuit is, respectively, controlled by a programming signal $P_O$ to $P_M$ which indicates the information to be recorded in the transistors of the pairs. Each reading circuit provides a, respective, signal $ELR_O$ to $ELR_M$ that is supplied to the column decoding circuit to select the repair column instead of the defective column.

Thus, there is only one programming circuit and only one reading circuit per column or battery $ELF_O$ to $ELM_F$, in the present invention. Furthermore, there is no validation fuse for each battery and no circuit for programming and reading a fuse. The result thereof is a reduction in the number of the transistors and hence a gain in space. It must be noted, however, that the device of the invention has two transistors per fuse and one inverter per address digit. However, these elements do not take up as much space as one programming circuit and one reading circuit, per fuse, would take.

The operation of the device shown in the Figure shall now be explained assuming that, in the address of the defective column, $A_0$=1 and $A_n$=0 and that the replacement column corresponds to the last column M.

The first operation is the programming or recording of the column $ELF_M$ by applying signals $P_M$=1 while $P_0$=0, to the respective columns. This applies a signal of $U_{BL}$=6 volts to the column $B_{LM}$ while the column $BL_0$ is left floating.

Furthermore, since $A_0$=1, a potential $U_{GR1}$=12 volts is applied to the gates of the transistors $C_{00}$ to $C_{MO}$ so that the transistor $CM_0$ is on. This corresponds to a value of $A_0$=1. As a result of the inverter $INV_0$ and of the voltage $U_{GR1}$=12 volts, a potential of zero volts is applied to the gates of the transistors $CI_{00}$ to $CI_{MO}$ so that the transistor $CI_{MO}$ remains off.

Since $A_n$=0, a potential of zero volt is applied to the gates of the transistors $C_{On}$ to $C_{Mn}$ so that the transistor $C_{Mn}$ remains off. As a result of the inverter $INV_n$, a potential $U_{GR1}$=12 volts is applied to the gates of the transistor $CI_{On}$ to $CI_{Mn}$ so that the transistor $CI_{MN}$ is on and records the value $A_n$=0. Should the batteries of fuses be addressed by a memory reading code with the digits $A_0$=1 and $A_n$=0, the pairs of cells $CP_{00}$ to $CP_{On}$ and $CP_{M0}$ to $CP_{Mn}$ behave as follows, assuming that $U_{gr2}$=5 volts. When the memory is being read, the potential $U_{GR3}$=5 volts is applied to the gates of the transistors $C_{00}$ to $C_{M0}$ so that the transistor which has been programmed, $C_{M0}$, is off. The potential $U_{GR2}$=5 volts is applied, by means of the inverter $INV_0$, to all the transistors $CI_{OO}$ to $CI_{MO}$ so that the transistor $CI_{MO}$ is off.

Furthermore, a potential of zero volt is applied to all the gates of the transistors $C_{On}$ to $C_{Mn}$ so that the transistor $C_{Mn}$ is off.

When the memory is being read, the potential $U_{GR1}$=5 volts is applied to all the gates of the transistors $CI_{On}$ to $CI_{Mn}$ so that the transistor $CI_{Mn}$ which has been programmed is off.

The result thereof is that all the transistors of the column $ELF_M$ that have recorded the code of the defective column, whether the digit is 0 or 1, remain off when the code is applied to them in reading; mode and there is therefore no current in the conductor $BL_M$. The reading circuit $L_M$ detects no current and gives a signal $ELR_M$ which activates the M order replacement column.

In all the other columns, there is at least one digit of the address code that is different from the one recorded in the column $ELF_M$ so that at least one transistor will be on and its current will be detected by the associated reading circuit. The corresponding replacement column will not be selected.

It must be noted that if there is no defective element in the memory, no cell of the redundancy device will be programmed and a current will be detected during the reading. Consequently, no replacement will be done.

Referring to the Figure, it can be seen that the batteries of fuses all take the form of memory cells organized in rows and columns as in a standard type of memory, but a memory in which the rows are grouped together two by two for their addressing. It must be noted that, as in a standard memory, each column conductor $BL_0$ to $BL_M$ is connected to a programming circuit $PR_0$ to $PR_M$ and to a reading circuit $L_0$ to $L_M$, these circuits being identical to those used in a standard memory. To make the device of the invention, it is possible to use the memory cells for which the device of the present invention has been designed as well as its associated circuits such as the programming and reading circuits.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A device with redundancy fuses for an integrated circuit memory, said integrated circuit memory being organized in rows and columns of memory cells and comprising several redundant elements, a redundant "element" being either a row or a column of the memory cells which replaces a defective element including one of a row or column of memory cells that includes at least one defective cell, said device storing an address of the defective element and selecting the redundant element to replace the defective element, wherein said device comprises, for each redundant element:

a column of memory cells arranged in pairs, each memory cell of a pair being responsive either directly to a digit of an address code or to a complement of the digit of the address code;

a programming circuit which provides a signal indicating, to said column of memory cells, that a defective column of memory cells corresponding to this address code has a defective cell; and a reading circuit that detects a presence or an absence of a current in said column of memory cells and which provides a signal for selecting the column of memory cells when no current is detected in said column of memory cells.

2. A device according to claim 1, wherein said columns of memory cells are organized in a matrix of rows and columns, which are addressed by the address codes.

3. A device according to claim 1 or 2, wherein each memory cell is formed by a floating-gate field-effect transistor having a drain coupled to a respective column, a gate coupled to input terminals for receiving the address codes and a source coupled to a supply terminal.

4. An integrated circuit memory, comprising:

a plurality of memory cells disposed in rows and columns;

a plurality of redundant elements, wherein a redundant element is one of a row and a column of redundant memory cells that replaces a defective element including one of a row and column of memory cells, each redundant memory cell comprising a pair of memory cells which are responsive to a respective bit of an address code;

means for programming each column of redundant memory cells with an address code of the defective element; and means for detecting a presence or an absence of a current in each column of redundant memory cells and for providing a selection signal for selecting the column of redundant memory cells when no current is detected in the column of redundant memory cells.

5. An integrated circuit memory for detecting a defective element, said defective element being one of a row and a column of memory cells, and for replacing the defective element with a redundant element, comprising:

a plurality of memory cells arranged in rows and columns;

a plurality of redundant elements, wherein said redundant element is one of a row and a column of memory cells and each memory cell of the redundant element comprises a pair of field effect transistors which are responsive to a respective bit of an address code;

a plurality of programming circuits, each programming circuit respectively coupled to a column of memory cells of the redundant element, that program the column of memory cells of the redundant element with an address of a defective column of memory cells; and a circuit that detects a presence or an absence of a current in the column of memory cells of the redundant element and that provides a selection signal indicating whether or not a current exists in the column of memory cells of the redundant element.

6. The integrated circuit memory of claim 5, further comprising a first supply circuit coupled to a source of each of the field effect transistors of the pair of field effect transistors of each memory cells of the redundant element.

7. The integrated circuit device of claim 6, further comprising a second supply circuit coupled to a drain of each field effect transistor of the pair of field effect transistors of each memory cell, through the respective programming circuit for the column of memory cells of the redundant element.

8. The integrated circuit memory of claim 5, further comprising an inverter having an output coupled to a gate of one of the field effect transistors for each memory cell, of the pair of field effect transistors for each memory cell, and having an input coupled to the respective address code bit.

9. A method for replacing a defective element of an integrated circuit memory with a redundant element, said defective element and said redundant element comprising one of a row and a column of memory cells, the method comprising the steps of:

detecting a defective cell in one of the row and column of memory cells;

programming a redundant column of memory cells with an address code of a defective column of memory cells;

receiving an address of a memory element to be read;

biasing off, all of the memory cells of the redundant column of memory cells if the address of the memory element to be read is the same as the address of the defective element;

detecting that no current exists within the redundant column of memory cells; and providing a selection signal for replacing the defective element with the redundant element when no current is detected in the redundant element.

10. The method for replacing the defective element of claim 9, further comprising the step of remaining inactive, if the address of the memory to be read is not the same as the address of the defective element.

11. The method for replacing the defective element of claim 9, further comprising the step of coupling the redundant column of memory cells to respective contacts of the memory if the redundant column of memory cells is to replace the defective element.

12. The method for replacing the defective element of claim 9, wherein the step of programming the redundant column of memory cells with the address further comprises the step of biasing on a first field effect transistor and biasing off a second field effect transistor, of a field effect transistor pair, for each memory cell of the redundant column of memory cells.

13. The method for replacing the defective element of claim 9, wherein the step of biasing off all the memory cells of the redundant column further comprises the step of biasing off a first field effect transistor and biasing off a second field effect transistor, of a field effect transistor pair, for each memory cell of the redundant column of memory cells.

14. The method for replacing the defective element of claim 9, further comprising the step of not programming the redundant column of memory cells with an address code of the defective element if no defective element exists within the integrated circuit memory.

15. The method for replacing the defective element of claim 14, further comprising the step of not biasing off all of the memory cells of the redundant column of memory cells when there is no defective element in the integrated circuit memory.

16. An integrated circuit memory, comprising:

a plurality of memory cells disposed in rows and columns;

a plurality of redundant elements, wherein a redundant element is a row of redundant memory cells that replace a defective element including a row of memory cells, each redundant memory cell comprising a pair of memory cells which are responsive to a respective bit of an address code;

means for programming each row of redundant memory cells with an address code of the defective element; and means for detecting a presence or an absence of a current in each redundant memory cell and for selecting the row of redundant memory cells when no current is detected in the row of redundant memory cells.

17. An integrated circuit memory, comprising:

a plurality of memory cells disposed in rows and columns;

a plurality of redundant memory cells that replace a defective memory cell, each redundant memory cell comprising a pair of field effect transistors which are responsive to a respective bit of an address code;

means for programming each redundant memory cell with an address bit;

means for detecting a presence or an absence of a current in each redundant memory cell; and means for substituting each redundant memory cell for a defective memory cell when no current is detected in the redundant memory cell.

* * * * *